United States Patent
Chen et al.

(10) Patent No.: US 11,643,523 B2
(45) Date of Patent: May 9, 2023

(54) STABILIZER COMPOSITION, ITS USE AND A PLASTIC COMPOSITION COMPRISING THE SAME

(71) Applicant: BASF SE, Ludwigshafen am Rhein (DE)

(72) Inventors: Lin Chen, Shanghai (CN); Suresh Parappuveetil Sarangadharan, Shanghai (CN)

(73) Assignee: BASF SE, Ludwigshafen am Rhein (DE)

( * ) Notice: Subject to any disclaimer, the term of this patent is extended or adjusted under 35 U.S.C. 154(b) by 21 days.

(21) Appl. No.: 16/954,122

(22) PCT Filed: Dec. 11, 2018

(86) PCT No.: PCT/EP2018/084336
§ 371 (c)(1),
(2) Date: Jun. 15, 2020

(87) PCT Pub. No.: WO2019/121160
PCT Pub. Date: Jun. 27, 2019

(65) Prior Publication Data
US 2021/0163712 A1    Jun. 3, 2021

(30) Foreign Application Priority Data

Dec. 19, 2017 (CN) ................. PCT/CN2017/117218

(51) Int. Cl.
| | |
|---|---|
| *C08K 5/5313* | (2006.01) |
| *C08K 3/16* | (2006.01) |
| *C08K 3/22* | (2006.01) |
| *C08K 5/00* | (2006.01) |
| *C08J 3/22* | (2006.01) |

(52) U.S. Cl.
CPC ............. *C08K 5/5313* (2013.01); *C08J 3/226* (2013.01); *C08K 3/16* (2013.01); *C08K 3/22* (2013.01); *C08K 5/005* (2013.01); *C08K 5/0091* (2013.01); *C08K 2003/2241* (2013.01)

(58) Field of Classification Search
CPC ......... C08L 77/00; C08K 3/16; C08K 5/5313; C08K 5/0091
See application file for complete search history.

(56) References Cited

U.S. PATENT DOCUMENTS

| | | | |
|---|---|---|---|
| 2,705,227 A * | 3/1955 | Gelu | ....................... C08L 77/00 523/307 |
| 6,207,737 B1 | 3/2001 | Schell et al. | |
| 7,009,029 B2 | 3/2006 | Oka et al. | |
| 8,426,549 B2 * | 4/2013 | Ogasawara | .......... C08G 69/265 524/413 |
| 8,598,280 B2 | 12/2013 | Khrenov et al. | |
| 8,628,699 B2 | 1/2014 | Meyer et al. | |
| 10,786,928 B2 | 9/2020 | Tochihara et al. | |
| 2008/0090945 A1 * | 4/2008 | Langrick | ................... D01F 1/10 524/94 |
| 2014/0171563 A1 | 6/2014 | Briffaud et al. | |
| 2014/0209969 A1 | 7/2014 | Bushelman et al. | |
| 2014/0221539 A1 | 8/2014 | Hong et al. | |

FOREIGN PATENT DOCUMENTS

| | | | | |
|---|---|---|---|---|
| CA | 2347258 A1 * | 4/2000 | ............... | C08K 5/02 |
| CN | 1143943 A | 2/1997 | | |
| CN | 101516945 A | 8/2009 | | |
| CN | 102007174 A | 4/2011 | | |
| CN | 103619934 A | 3/2014 | | |
| CN | 103890040 A | 6/2014 | | |
| CN | 105602243 A | 5/2016 | | |
| CN | 106661234 A | 5/2017 | | |
| EP | 1121388 A1 * | 8/2001 | ........... | C08K 5/0091 |
| EP | 1266930 A1 * | 12/2002 | ........... | C04B 41/009 |
| WO | 0022035 A1 | 4/2000 | | |
| WO | 2011141365 A1 | 11/2011 | | |

OTHER PUBLICATIONS

Machine translation of EP 1121388 (2001, 17 pages).*
International Search Report and Written Opinion for corresponding PCT/EP2018/084336 dated Mar. 6, 2019, 9 pages.
"Additives for Polyamides" Brueggemann Chemical, Sep. 2019, pp. 1-8, https://www.brueggemann.com/_Resources/Persistent/c2623bc6dff8602e9a0f41b180299cc5d9196f22/191001_PolymerAdditives_2019_EN_WEB.pdf.
Anonymous, "Additives for Polyamides", Brueggemann Chemical, XP002788830, Oct. 31, 2016, pp. 1-8.
Ferry, et al., "Design and analysis of biological assays of mixtures", Annual Conference on Applied Statistics in Agriculture—17th Annual Conference Proceedings, Apr. 24, 2005, pp. 33-50.

* cited by examiner

*Primary Examiner* — Brieann R Johnston
(74) *Attorney, Agent, or Firm* — Armstrong Teasdale LLP

(57) ABSTRACT

The present disclosure relates to a stabilizer composition, and its use for improving the anti-yellowing of a plastic used in areas where anti-yellowing is needed, such as polyamide, especially semi-aromatic polyamide. Moreover, the present disclosure relates to a plastic composition including the stabilizer composition. The plastic composition of the present disclosure could be used in, for example, out-door housing for consumer parts, automotive exterior parts, or a highly reflective application, more particularly in the manufacturing of light-emitting diode (LED) components.

18 Claims, No Drawings

STABILIZER COMPOSITION, ITS USE AND A PLASTIC COMPOSITION COMPRISING THE SAME

CROSS-REFERENCE TO RELATED APPLICATIONS

This application is a U.S. National Phase Application of PCT/EP2018/084336, filed on Dec. 11, 2018, which claims the benefit of priority to Chinese Patent Application Number PCT/CN2017/117218, filed Dec. 19, 2017, the entire contents of which are hereby incorporated by reference herein.

TECHNICAL FIELD

The present invention relates to a stabilizer composition, and its use for improving the anti-yellowing of a plastic. Moreover, the present invention relates to a plastic composition comprising the stabilizer composition.

BACKGROUND

Plastic materials are widely used in areas where anti-yellowing is needed, such as out-door housing for consumer parts, automotive exterior parts, or a highly reflective application, more particularly in the manufacturing of light-emitting diode (LED) components. Among them, polyamide, especially semi-aromatic polyamide has been extensively used as a low cost and easily processing material to replace ceramics for LED components, such as housings, reflectors and reflector plates, where excellent heat resistance and high light reflectivity are desired. Although compared with other high temperature resins such as polycyclohexylenedimethylene terephthalate (PCT), polyamide, especially semi-aromatic polyamide has significantly better processability and mechanical properties, one problem that continuously puzzles the polyamide compositions used in LED applications is that they tend to get yellow when exposed long-term to heat during manufacturing or end use, which will cause a significant reflectivity drop.

During the past, a number of formulation technologies have been developed to solve this problem and indeed there are some progresses.

For example, U.S. Pat. No. 7,009,029 describes a high reflective thermoplastic polyphthalamide (PPA) molding composition comprising a white pigment titanium dioxide with a well controlled particle size; CN103890040 describes a polyamide composition with improved reflectivity after heat aging by using an additive of magnesium oxide; EP2723807 further optimizes this stabilizer by combining magnesium oxide with organic phosphite.

Moreover, CN103619934A describes a composition with a good heat resistance and a very good LED resistance, which comprises at least one semi-aromatic polyamide, a white pigment, at least one metal hydroxide and/or at least one metal oxide other than a transition metal oxide, and an organic phosphite.

Moreover, CN105602243A describes a polyamide composition and the application thereof. The polyamide composition comprises A) 30 to 90 parts by weight of a semi-aromatic polyamide resin and B) 10 to 50 parts by weight of a white pigment and/or a reinforcing filling material, wherein the mass ratio of elemental magnesium to elemental phosphorus in the polyamide composition is 0.1-100:1.

However, these progresses are still not satisfying for the real application, especially when the aging temperature is very high (190° C. or higher) or the aging time is very long (500 h or longer). There is still some gap in term of anti-yellowing performance compared with PCT. Therefore, it's quite necessary and market valuable to develop a plastic composition with better reflectivity performance as molded and after thermal aging.

SUMMARY OF THE INVENTION

It has been surprisingly found that by incorporating a stabilizer composition comprising an organic copper complex and an organic phosphinate salt into a plastic used in areas where anti-yellowing is needed, such as out-door housing for consumer parts, automotive exterior parts, or a highly reflective application, more particularly in the manufacturing of light-emitting diode (LED) components, a very good anti-yellowing performance and thus an excellent reflectivity even after long time thermal aging have been achieved. Based on this discovery, the inventors have finished the present invention.

Thus, an object of the invention is to provide a stabilizer composition, which could improve the anti-yellowing performance of a plastic used in areas where anti-yellowing is needed, such as out-door housing for consumer parts, automotive exterior parts, or a highly reflective application, more particularly in the manufacturing of light-emitting diode (LED) components.

Another object of the present invention is to provide the use of the stabilizer composition for improving the anti-yellowing of a plastic used in areas where anti-yellowing is needed, such as out-door housing for consumer parts, automotive exterior parts, or a highly reflective application, more particularly in the manufacturing of light-emitting diode (LED) components.

Another object of the present invention is to provide a plastic composition comprising the stabilizer composition, which shows a very good anti-yellowing performance and thus an excellent reflectivity even after long time thermal aging.

DETAILED DESCRIPTION OF THE INVENTION

The objects of the present invention could be achieved by a stabilizer composition, which comprises an organic phosphinate salt and a mixture comprising an organic copper complex.

Therefore, in the first aspect, the present invention relates to a stabilizer composition, which comprises an organic phosphinate salt and a mixture comprising an organic copper complex.

The mixture comprising an organic copper complex may further comprise a halogen-containing compound. The halogen-containing compound is preferably metal halide, for example but not limited to, a halide such as KCl, KBr and/or KI, etc.

Preferably, the mixture comprises from about 50% to about 75% by weight of the halogen-containing compound, and from about 25% to about 50% by weight of the organic copper complex, in each case based on the total weight of the mixture. More preferably, the mixture may be in a form of a blend containing from about 50% to about 75% by weight of potassium iodide and from about 25% to about 50% by weight of the organic copper complex, in each case based on the total weight of the mixture.

The organic copper complex is a coordination compound with a copper atom (or ion) as coordination center and an organic moiety as organic ligand. Typical examples of the organic ligands are triphenyl phosphine, mercaptobenzimidazole, ethylenediaminetetraacetic acid (EDTA), acetylacetonate, ethylenediamine, oxalate, diethylenetriamine, triethylenetetramine, pyridine, diphosphone and/or dipyridyl. Preferred organic ligands are triphenyl phosphine and/or mercaptobenzimidazole.

Preferred copper complexes used in accordance with the present invention are typically prepared by the reaction of copper ions with the organic ligand.

The organic phosphinate salt could be represented by below formula,

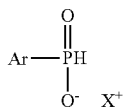

wherein Ar could be $C_6$ to $C_{18}$ aryl and X is a metal cation selected from Na, Ca, Mg, Al or Zn. The $C_6$ to $C_{18}$ aryl may be unsubstituted or substituted by a substituent such as $C_1$-$C_{10}$ alkyl, $C_3$-$C_{10}$ cycloalkyl, $C_1$-$C_{10}$ alkoxy, $C_3$-$C_{10}$ cycloalkoxy, $C_1$-$C_{10}$ alkylthio, $C_3$-$C_{10}$ cycloalkylthio, $C_1$-$C_{10}$ alkylamino, $C_3$-$C_{10}$ cycloalkylamine, $C_6$-$C_{18}$ aryl, $C_6$-$C_{18}$ aryloxy, $C_6$-$C_{18}$ arylthio, $C_6$-$C_{18}$ arylamino, halogen and the like, and combinations thereof. Preferably, the $C_6$ to $C_{18}$ aryl may be $C_6$ to $C_{16}$ aryl, preferably $C_6$ to $C_{14}$ aryl, more preferably $C_6$ to $C_{12}$ aryl, most preferably phenyl or naphthyl. Preferably, the phosphinate salt is sodium benzene phosphinate.

The stabilizer composition according to the present invention could be prepared by mixing the individual components together. The ratio of the weight of the organic phosphinate salt to the mixture comprising an organic copper complex may be, for example, from about 0.1 to about 10, preferably from about 0.2 to about 8, more preferably from about 0.3 to about 3.

It has been surprisingly found that by using the stabilizer composition according the invention in a plastic, especially a polyamide, in particular a semi-aromatic polyamide, a very good anti-yellowing performance and thus an excellent reflectivity even after long time thermal aging have been achieved.

Therefore, in the second aspect, the present invention relates to the use of the stabilizer composition according the invention for improving the anti-yellowing of a material used in areas where anti-yellowing is needed.

The base resin for the material used in areas where anti-yellowing is needed could be plastic. The plastic could be a thermoplastic plastic, such as a polyamide, polycarbonate, polyethylene terephthalate, and/or polybutylene terephthalate, preferably a polyamide, especially a semi-aromatic polyamide, in particular thermoplastic polyphthalamide (PPA). The material comprising the stabilizer composition could be used in areas where anti-yellowing is needed, such as out-door housing for consumer parts, automotive exterior parts, or a highly reflective application, more particularly in the manufacturing of light-emitting diode (LED) components.

As is described above, polyamide, especially semi-aromatic could be used for LED components, such as housings, reflectors and reflector plates. However, they suffered from yellowing when exposed long-term to heat during manufacturing or end use. It has been surprisingly found that the stabilizer composition according the invention is highly suitable for using in the semi-aromatic polyamide and results in a very good anti-yellowing performance and thus an excellent reflectivity even after long time thermal aging have been achieved.

Therefore, in the third aspect, the present invention relates to a plastic composition, which comprises the stabilizer composition of the present invention.

The plastic used in the present invention could be any of the conventional plastic, especially thermoplastic, such as polyamide, polycarbonate, polyethylene terephthalate, and/or polybutylene terephthalate. Preferably, the plastic is a polyamide, especially a thermoplastic polyamide, such as aliphatic polyamide and/or semi-aromatic polyamide, as well as amorphous polyamide and/or semi-crystalline polyamide, and/or polyamide copolymers thereof.

The repeating unit of the polyamide may be obtained from at least one component selected from the group consisting of (A) lactam, (B) dicarboxylic acids and diamine, and (C) aminocarboxylic acid.

The suitable lactam is preferably a lactam comprising from 6 to 12 carbon atoms, for example butyrolactam, 2-pyrrolidone (γ-butyrolactam), valerolactam, 2-piperidone (δ-valerolactam), ε-caprolactam, capryllactam, decanolactam, undecanolactam, enantholactam, and/or lauryllactam, more preferably is ε-caprlactam.

The dicarboxylic acid could be aliphatic dicarboxylic acid, cycloaliphatic dicarboxylic acid and/or aromatic dicarboxylic acid.

The suitable aliphatic dicarboxylic acid is preferably an aliphatic dicarboxylic acid comprising from 4 to 24 carbon atoms, for example succinic acid, glutaric acid, adipic acid, pimelic acid, suberic acid, azelaic acid, sebacic acid, undecane-1,11-dicarboxylic acid, dodecane-1,12-dicarboxylic acid, fumaric acid and/or itaconic acid.

The suitable cycloaliphatic dicarboxylic acid is preferably comprise at least one carbon backbone selected from the group consisting of cyclohexane, cyclopentane, cyclohexylmethane, dicyclohexylmethane, bis(methylcyclohexyl), more preferably cis- and trans-cyclopentane-1,3-dicarboxylic acid, cis- and trans-cyclopentane-1,4-dicarboxylic acid, cis- and trans-cyclohexane-1,2-dicarboxylic acid, cis- and trans-cyclohexane-1,3-dicarboxylic acid, cis- and trans-cyclohexane-1,4-dicarboxylic acid.

The suitable aromatic dicarboxylic acid is preferably terephthalic acid, isophthalic acid, naphthalenedicarboxylic acids and/or diphenyldicarboxylic acids.

The diamine could be aliphatic diamine, cycloaliphatic diamine and/or aromatic diamine.

The suitable aliphatic diamine is preferably an aliphatic diamine comprising from 4 to 24 carbon atoms, for example butanediamine, pentanediamine, hexanediamine, heptanediamine, octanediamine, nonanediamine, decanediamine, undecanediamine, dodecanediamine, tridecanediamine, tetradecanediamine, hexadecanediamine, octadecanediamine, octadecenediamine, eicosanediamine, docosanediamine, 2-methylpentanediamine, 2-methyl-1,8-octanediamine, 2,2,4-trimethylhexamethylenediamine, 2,4,4-trimethylhexamethylenediamine, 5-methylnonane-1,9-diamine, and/or 2,4-dimethyloctanediamine.

The suitable cycloaliphatic diamine is preferably bis(3,5-dialkyl-4-aminocyclohexyl)methane, bis(3,5-dialkyl-4-aminocyclohexyl)ethane, bis(3,5-dialkyl-4-aminocyclohexyl)propane, bis(3,5-dialkyl-4-aminocyclohexyl)butane, bis(3-methyl-4-aminocyclohexyl)methane (BMACM or MACM), p-bis(aminocyclohexyl)methane (PACM), isopropylidenedi(cyclohexylamine) (PACP) and/or isophoronediamine (IPDA).

The suitable aromatic diamine is preferably m-xylenediamine(MXDA), p-xylylenediamine, bis(4-aminophenyl)methane, 3-methylbenzidine, 2,2-bis(4-aminophenyl)propane, 1,1-bis(4-aminophenyl)cyclohexane, 1,2-diaminobenzene, 1,3-diaminobenzene, 1,4-diaminobenzene, 1,2-diaminonaphthalene, 1,3-diaminonaphthalene, 1,4-diaminonaphthalene, 2,3-diaminotoluene, N,N'-dimethyl-4,4'-bephenyldiamine, bis(4-methylaminophenyl)methane, and/or 2,2'-bis(4-methylaminophenyul)propane.

The suitable aminocarboxylic acid is preferably 6-aminocaproic acid, 7-aminoheptanoic acid, 9-aminononanoic acid, 10-aminodecanoic acid, 11-aminoundecanoic acid, and/or 12-aminododecanoic acid.

In a preferred embodiment, the polyamide is at least one of the group consisting of PA 5, PA 6, PA 8, PA 9, PA 10, PA 11, PA 12, PA 13, PA 14, PA 4.6, PA 4.8, PA 4.10, PA 4.12, PA 5.5, PA 5.10, PA 5.12, PA 6.6, PA 6.8, PA 6.9, PA 6.10, PA 6.12, PA 6.18, PA 8.8, PA 8.10, PA 8.12, PA 9.9, PA 9.10, PA 9.12, PA 10.10, PA 10.12, PA 10.14, PA 10.18, PA 12.12, PA 12.14, PA 12.18, PA 4.T, PA 6.T, PA 9.T, PA 8.T, PA 10.T, PA 12.T, PA4.I, PA 6.I, PA 8.I, PA 9.I, PA 10.I, PA 12.I, PA MXDA.6, PA IPDA.I, PA IPDA.T, PA MACM.I, PA MACM.T, PA PACM.I, PA PACM.T, PA MXDA.I, and PA MXDA.T.

In a preferred embodiment, the copolyimide is at least one of the group consisting of PA 6/6.6, PA 6/12, PA6/11, PA 6.6/11, PA 6.6/12, PA 6/6.10, PA 6.6/6.10, PA 4.6/6, PA6/6.6/6.10, PA 6.T/6, PA 6.T/10, PA 6.T/12, PA 6.T/6.I, PA 6.T/8.T, PA 6.T/9.T, PA 6.T/10.T, PA 6.T/12.T, PA 6.T/6.I/6, PA 6.T/6.I/12, PA 6.T/6.I/6.10, PA 6.T/6.I/6.12, PA 6.T/6.6, PA 6.I/6.6, PA6.T/6.10, PA 6.T/6.12, PA 10T/6, PA 10.T/11, PA 10.T/12, PA 8.T/66, PA 8.T/8.I, PA 8.T/8.6, PA 8.T/6.I, PA 10.T/6.6, PA 10.T/10.I, PA 10T/10.I/6.T, PA 10.T/6.I, PA 4.T/4.I/46, PA 4.T/4.I/6.6, PA 5.T/5.I, PA 5.T/5.I/5.6, PA 5.T/5.I/6.6, PA 6.T/6.I/6.6, PA 6.T/IPDA.T, PA 6.T/MACM.T, PA 6.T/PACM.T, PA 6.T/MXDA.T, PA 6.T/6.I/8.T/8.I, PA 6.T/6.I/10.T/10.I, PA 6.T/6.I/IPDA.T/IPDA.I, PA 6.T/6.I/MXDA.T/MXDA.I, PA 6.T/6.I/MACM.T/MACM.I, PA 6.T/6.I/PACM.T/PACM.I, PA 6.T/10.T/IPDA.T, PA 6.T/12.T/IPDA.T, PA 6.T/10.T/PACM.T, PA 6.T/12.T/PACM.T, PA 10.T/IPDA.T, and/or PA 12.T/IPDA.T.

The amount of the polyamide may be 30%-97%, preferably 40%-80%, more preferably 45%-70%, based on the total weight of the plastic composition.

The amount of the semi-aromatic polyamide may be 30%-97%, preferably 40%-80%, more preferably 45%-70%, based on the total weight of the plastic composition.

The amount of the mixture comprising the organic copper complex may be from about 0.1% to about 2%, preferably from about 0.2% to about 1.5%, more preferably from about 0.3% to about 1%, based on the total weight of the plastic composition.

The amount of the organic phosphinate salt may be from about 0.05% to about 2%, preferably from about 0.1% to about 1%, more preferably from about 0.2% to about 0.8%, based on the total weight of the plastic composition.

The plastic composition may comprise a white pigment. The white pigment could be any conventional white pigment in the art, such as $TiO_2$, ZnS, ZnO, $BaSO_4$, and the mixture thereof.

The amount of the white pigment may be from about 2% to about 50%, preferably from about 10% to about 45%, more preferably from about 20% to about 40%, based on the total weight of the plastic composition.

The plastic composition of the present invention may comprise fillers, such as glass fiber, mineral powder (such as talcum powder, wollastonite, mica).

The amount of the fillers may be from 0 to about 50%, preferably from 0 to about 30%, more preferably from 0 to about 20%, based on the total weight of the plastic composition.

Furthermore, the plastic composition of the present invention may comprise various other additives, such as impact improvers, antistatic agents, conductivity imparting agents, heat stabilizers, light stabilizers (especially UV stabilizers), lubricants and flame retardants. The additives may be used each alone or in combinations. Such additives are well known in the art and could be available commercially.

As the examples of the impact improvers, the followings should be mentioned: copolymers of olefins, copolymers of olefins and $\alpha,\beta$-unsaturated carboxylic acid, and elastomers such as styrene-based elastomers. The addition of the impact improver would improve the impact strength of the composition.

As the examples of the antistatic agents, the followings should be mentioned: anionic antistatic agents, cationic antistatic agents and nonionic antistatic agents. As the examples of the conductivity imparting agent, the followings should be mentioned: carbon black, carbon fiber and metal fiber.

As the examples of the heat stabilizers, the followings should be mentioned: hindered phenolic compounds, phosphite-based compounds, hindered amine-based compounds, triazine-based compounds and sulfur-based compounds.

As the examples of the light stabilizers, the followings should be mentioned: benzophenone-based compounds, benzotriazole-based compounds, salicylate-based compounds, hindered amine-based compounds and hindered phenolic compounds.

As the examples of the lubricants, the followings should be mentioned: fluororesins such as polytetrafluoroethylene; silicones such as polydimethylsiloxane and fluorine-modified polydimethylsiloxane; and waxes such as natural and synthetic waxes, for example, montanic acid waxes, montanic ester waxes, carnauba wax, polyethylene wax, oxidized waxes, polyvinyl ether waxes, ethylene vinyl acetate wax and mixtures of the aforementioned waxes.

As the examples of the flame retardants, the followings should be mentioned: bromine-containing flame retardants, nitrogen-containing flame retardants, phosphorus-containing flame retardants and nitrogen-phosphorus-containing flame retardants; and hydrated metal-based flame retardants.

In a preferable embodiment, the plastic composition comprises,
A). from about 30% to about 97% of a semi-aromatic polyamide,
B). from about 2% to about 50% of a white pigment,
C). from about 0.1% to about 2% of a mixture comprising an organic copper complex,
D). from about 0.05% to about 2% of an organic phosphinate salt,
E). from 0 to about 50% of a filler.

In the present invention, the amounts of the individual components add up to 100% by weight, based on the total weight of the plastic composition. Moreover, the ranges and the preferable ranges of the individual components could be combined with each other.

The plastic compositions according to the invention may be prepared via any method that makes it possible to obtain a homogeneous mixture, such as melt extrusion, compacting or roll blending. Advantageously, the composition may be obtained in the form of granules by compounding on a tool known to those skilled in the art, such as a twin-screw extruder, a co-kneader or an internal mixer.

The plastic composition of the present invention shows a very good anti-yellowing performance and thus an excellent reflectivity even after long time thermal aging, which make it suitable for a highly reflective application, more particularly in the manufacturing of light-emitting diode (LED) components.

Therefore, in the fourth aspect, the present invention relates to an article obtainable from the plastic composition. More particularly, the article may be the light-emitting diode (LED) components, such as housings, reflectors and reflector plates.

The articles according to the invention could be prepared by injection moulding, extrusion, extrusion blow-molding, co-extrusion etc., by using the composition as defined above.

During injection moulding, the plastic composition according to the invention is heat-melted in the cylinder of the injection molding, injected into a die in a molten state, cooled and solidified in a predetermined shape, and then taken out as a molded body from the die. The resin temperature at the time of injection molding is required to be set at a temperature equal to or higher than the melting point of the polyamide and lower than the melting point +100° C. The plastic composition to be used for injection molding is preferably sufficiently dried. A semi-aromatic polyamide high in water content undergoes foaming in the cylinder of an injection molding machine, and sometimes it comes to be difficult to obtain an optimal molded body.

The present invention is described specifically by way of examples. However, the present invention is not limited by the Examples.

EXAMPLES

The raw materials used in the examples are as follows.

| | |
|---|---|
| PA9T | Base Resin, Polynonamethylene terephthalamide with weight averaged molecular weight of 30000 |
| Bruggolen H3350 | A mixture comprising an organic Cu salt complex and KI, available from Brüggemann-Gruppe, Germany |
| Hostanox ® P-EPQ | Organic Phosphite salt, available from Clariant |
| SBP | Sodium Benzene Phosphinate, available from Hangzhou Chemfar Ltd |
| $NaHPO_2$ | Inorganic Phosphinate salt |
| HIWAX 110P | Lubricant, available from Mitsui Chemicals |
| NYLOSTAB S-EED | UV stabilizer, available from Clariant |
| $TiO_2$ | $TiO_2$ Kronos 2220, available from Kronos |

The formulations for the examples are shown in the following Table 1. The raw materials were mixed together in a high-speed stirrer (Turbula T50A, from Glen Mills Inc.), fed into a twin-screw extruder (Coperion ZSK26MC, from Coperion Werner & Pfleiderer GmbH, Germany), melt-extruded under a temperature of 320° C., pelletized, thus obtaining a semi-aromatic polyamide composition in a pellet form. Then the thus-obtained composition was dried in an oven under a temperature of 120° C. for 8 hours, then molded by an injection molding machine (KM130CX, from Krauss Maffei with a clamping force of 130T) under a temperature of 300° C., thus obtaining the specimens for test. Material flow length (SPF) was also measured on this machine using a spiral flow tooling with a 500 bar pressure at 320° C. melt temperature and 140° C. mold temperature. The melt is injected into a spiral runner of constant cross section (2 mm thickness and 5.5 mm width) with numbered and subdivided centimeters marked along the runner. The mold is filled from a sprue at the center of the spiral and pressure is maintained until flow stops, the number just at the molded-spiral tip giving the flow length. The reflectivity test was measure by a DC500 Spectrophotometer from Datacolor company at the wavelength of 460 nm using a molded plastic plaque (60×60×2 mm) sample.

TABLE 1

Formulations for compositions of the examples and the comparative examples, wherein the amounts are weight percentage based on the total composition

| | E1* | E2 | CE1** | CE2 | CE3 | CE4 |
|---|---|---|---|---|---|---|
| PA9T | 58.7 | 58.6 | 58.7 | 58.7 | 58.7 | 58.8 |
| H3350 | 0.5 | 0.3 | 0.7 | | 0.5 | |
| P-EPQ | | | | 0.5 | | |
| SBP | 0.2 | 0.5 | | 0.2 | | 0.6 |
| $NaHPO_2$ | | | | | 0.2 | |
| HIWAX 110P | 0.5 | 0.5 | 0.5 | 0.5 | 0.5 | 0.5 |
| S-EED | 0.1 | 0.1 | 0.1 | 0.1 | 0.1 | 0.1 |
| $TiO_2$ | 40 | 40 | 40 | 40 | 40 | 40 |

*"E" stands for "Example".
**"CE" stands for "Comparative Example".

Various tests were carried out on the obtained specimens, and the results are shown in the following Table 2.

TABLE 2

Performances of the compositions of the examples and the comparative examples

| Performance | | unit | E1 | E2 | CE1 | CE2 | CE3 | CE4 |
|---|---|---|---|---|---|---|---|---|
| SPF, 320° C. | | cm | 53 | 55 | 59 | 55 | 54 | 57 |
| TM (Tensile Modulus) | ISO-527-2-2012 | MPa | 4180 | 4130 | 4270 | 4160 | 4190 | 4330 |
| TS (break) (Tensile Stress) | ISO-527-2-2012 | MPa | 53 | 51 | 46 | 55 | 51 | 47 |
| TE (break) (Tensile enlongation) | ISO-527-2-2012 | % | 1.3 | 1.3 | 1.1 | 1.4 | 1.3 | 1.2 |
| Charpy impact strength, notched | ISO 3167 | $KJ/m^2$ | 1.9 | 1.9 | 1.8 | 1.8 | 2.5 | 1.9 |
| Charpy impact strength, unnotched | ISO 3167 | $KJ/m^2$ | 21 | 20 | 18 | 23 | 19 | 13 |
| Heat deflection temperature, 1.82 Mpa | ISO 75-2-2013 | C | 133 | 133 | 127 | 129 | 132 | 145 |
| Reflectivity, as casted | | | 91.9 | 90 | 90.5 | 89.7 | 88.4 | 89.5 |
| Reflectivity, 190° C. | | | 91.3 | 88.9 | 88.7 | 87.2 | 86.6 | 85.5 |

TABLE 2-continued

Performances of the compositions of the examples and the comparative examples

| Performance | unit | E1 | E2 | CE1 | CE2 | CE3 | CE4 |
|---|---|---|---|---|---|---|---|
| 1 h aging Reflectivity Drop, 190° C. 1 h aging | % | 0.7 | 1.2 | 2.0 | 2.8 | 2.0 | 4.5 |
| Reflectivity, 120° C. 500 h aging | | 90.5 | 89 | 85.1 | 83.5 | 87.6 | 86 |
| Reflectivity Drop, 120° C. 500 h aging | % | 1.5 | 1.1 | 6.0 | 6.9 | 0.9 | 3.9 |
| Reflectivity, 120° C. 1000 h aging | | 89.2 | 88.1 | 83.5 | 80.4 | 86.6 | 82.9 |
| Reflectivity Drop, 120° C. 1000 h aging | % | 2.9 | 2.1 | 7.7 | 10.4 | 2.0 | 7.4 |

As shown in Table 2, the polyamide composition comprising the present stabilization package (organic phosphinate salt and a mixture comprising an organic Cu salt complex and KI), i.e., E1 & E2, shows a high initial reflectivity (>90%) as well as a low reflectivity decay after thermal aging at both high temperature (190° C.) and medium temperature (120° C.). Moreover, the molding compositions of the present invention also possess good flowability and mechanical properties. Obviously, such excellent performances cannot be achieved if only one type of the two stabilizers is used because both initial and aged reflectivity will be damaged as shown in CE1 & CE4. More evidently, the components of CE3 are as same as those of E1 with the only exception that E1 uses a phosphinate, while CE3 uses a phosphite; however, the reflectivity of CE3 in any cases are lower than those of E1.

What is claimed is:

1. A stabilizer composition comprising an organic phosphinate salt and a mixture comprising an organic copper complex, wherein the mixture further comprises a halogen-containing compound, wherein the mixture comprises from about 50% to about 75% by weight of the halogen-containing compound, and from about 25% to about 50% by weight of the organic copper complex, in each case based on a total weight of the mixture;
wherein the halogen-containing compound is a metal halide;
wherein the organic copper complex is a coordination compound with a copper atom or ion as coordination center and an organic moiety as organic ligand, and wherein the organic moiety is at least one selected from the group consisting of triphenyl phosphine, mercaptobenzimidazole, ethylenediaminetetraacetic acid, acetylacetonate, ethylenediamine, oxalate, diethylenetriamine, triethylenetetramine, pyridine, diphosphone and dipyridyl; and
wherein a ratio of a weight of the organic phosphinate salt to a weight of the mixture comprising the organic copper complex is from about 0.1 to about 10.

2. The stabilizer composition according to claim 1, wherein the mixture comprises from about 50% to about 75% by weight of potassium iodide and from about 25% to about 50% by weight of the organic copper complex, in each case based on the total weight of the mixture.

3. The stabilizer composition according to claim 1, wherein the organic phosphinate salt is represented by below formula,

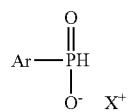

wherein Ar is $C_6$ to $C_{18}$ aryl and X is a metal cation selected from Na, Ca, Mg, Al or Zn.

4. The stabilizer composition according to claim 3, wherein the $C_6$ to $C_{18}$ aryl is unsubstituted or substituted by a substituent selected from the group consisting of $C_1$-$C_{10}$ alkyl, $C_3$-$C_{10}$ cycloalkyl, $C_1$-$C_{10}$ alkoxy, $C_3$-$C_{10}$ cycloalkoxy, $C_1$-$C_{10}$ alkylthio, $C_3$-$C_{10}$ cycloalkylthio, $C_1$-$C_{10}$ alkylamino, $C_3$-$C_{10}$ cycloalkylamine, $C_6$-$C_{18}$ aryl, $C_6$-$C_{18}$ aryloxy, $C_6$-$C_{18}$ arylthio, $C_6$-$C_{18}$ arylamino, halogen, and combinations thereof.

5. The stabilizer composition according to claim 3, wherein the $C_6$ to $C_{18}$ aryl is $C_6$ to $C_{16}$ aryl.

6. The stabilizer composition according to claim 1, wherein the ratio of the weight of the organic phosphinate salt to the weight of the mixture comprising the organic copper complex is from about 0.2 to about 8.

7. A method of using the stabilizer composition according to claim 1, the method comprising adding the stabilizer composition to a plastic to improve anti-yellowing of the plastic used in areas where anti-yellowing is needed.

8. A plastic composition, which comprises the stabilizer composition according to claim 1.

9. The plastic composition according to claim 8, wherein the plastic is a thermoplastic.

10. The plastic composition according to claim 9, wherein the thermoplastic is a polyamide and wherein the amount of the polyamide is from about 30% to about 97%, based on a total weight of the plastic composition.

11. The plastic composition according to claim 8, wherein the amount of the mixture comprising organic copper complex is from about 0.1% to about 2%, based on a total weight of the plastic composition.

12. The plastic composition according to claim 8, wherein the amount of the organic phosphinate salt is from about 0.05% to about 2%, based on a total weight of the plastic composition.

13. The plastic composition according to claim 8, wherein the plastic composition further comprises a white pigment.

14. The plastic composition according to claim 13, wherein the amount of the white pigment is from about 2% to about 50%, based on a total weight of the plastic composition.

15. The plastic composition according to claim 8, further comprising,

A). from about 30% to about 97% of a semi-aromatic polyamide,
B). from about 2% to about 50% of a white pigment,
C). from about 0.1% to about 2% of the mixture comprising the organic copper complex,
D). from about 0.05% to about 2% of the organic phosphinate salt, and
E). from 0 to about 50% of a filler.

16. An article obtainable from the plastic composition according to claim 8.

17. The plastic composition according to claim 10, wherein the polyamide is aliphatic polyamide and/or semi-aromatic polyamide and/or copolymers thereof.

18. The stabilizer composition according to claim 1, wherein the organic moiety is triphenyl phosphine, mercaptobenzimidazole, or both.

* * * * *